United States Patent
Luo et al.

(10) Patent No.: US 9,727,047 B2
(45) Date of Patent: Aug. 8, 2017

(54) DEFECT DETECTION USING STRUCTURAL INFORMATION

(71) Applicant: KLA-Tencor Corporation, Milpitas, CA (US)

(72) Inventors: Qing Luo, Fremont, CA (US); Kenong Wu, Davis, CA (US); Hucheng Lee, Cupertino, CA (US); Lisheng Gao, Morgan Hill, CA (US); Eugene Shifrin, Sunnyvale, CA (US); Yan Xiong, Sunnyvale, CA (US); Shuo Sun, Fremont, CA (US)

(73) Assignee: KLA-Tencor Corp., Milpitas, CA (US)

( * ) Notice: Subject to any disclaimer, the term of this patent is extended or adjusted under 35 U.S.C. 154(b) by 0 days.

(21) Appl. No.: 14/880,187

(22) Filed: Oct. 9, 2015

(65) Prior Publication Data

US 2016/0104600 A1    Apr. 14, 2016

Related U.S. Application Data

(60) Provisional application No. 62/063,841, filed on Oct. 14, 2014.

(51) Int. Cl.
*G05B 19/401* (2006.01)
*H01L 21/66* (2006.01)

(52) U.S. Cl.
CPC .. *G05B 19/401* (2013.01); *G05B 2219/37365* (2013.01); *G05B 2219/37571* (2013.01);
(Continued)

(58) Field of Classification Search
None
See application file for complete search history.

(56) References Cited

U.S. PATENT DOCUMENTS 6,490,375 B1 * 12/2002 Garakani ............. G06K 9/4609
                                                    348/356
8,270,698 B2 *  9/2012 Geiger .................... G06T 7/68
                                                    382/100
(Continued)

FOREIGN PATENT DOCUMENTS

JP            5647999 B2 *  1/2015

OTHER PUBLICATIONS

Machine translation JP5647999B2.*
International Search Report for PCT/US2015/055295 mailed Dec. 28, 2015.

*Primary Examiner* — Michelle Hausmann
(74) *Attorney, Agent, or Firm* — Ann Marie Mewherter

(57) ABSTRACT

Systems and methods for detecting defects on a specimen based on structural information are provided. One system includes one or more computer subsystems configured for separating the output generated by a detector of an inspection subsystem in an array area on a specimen into at least first and second segments of the output based on characteristic(s) of structure(s) in the array area such that the output in different segments has been generated in different locations in the array area in which the structure(s) having different values of the characteristic(s) are formed. The computer subsystem(s) are also configured for detecting defects on the specimen by applying one or more defect detection methods to the output based on whether the output is in the first segment or the second segment.

18 Claims, 9 Drawing Sheets

(52) U.S. Cl.
CPC . *H01J 2237/221* (2013.01); *H01J 2237/2817* (2013.01); *H01L 22/12* (2013.01); *H01L 22/20* (2013.01)

(56) References Cited

U.S. PATENT DOCUMENTS

| | | |
|---|---|---|
| 8,775,101 B2 | 7/2014 | Huang et al. |
| 8,825,570 B2* | 9/2014 | Forman ............... G06N 99/005 706/12 |
| 8,907,303 B2* | 12/2014 | Momoi .................. H01J 37/20 250/306 |
| 9,123,583 B2* | 9/2015 | Lin ........................ H01L 22/12 |
| 9,401,016 B2 | 7/2016 | Kulkarni |
| 2002/0054291 A1 | 5/2002 | Tsai et al. |
| 2007/0096094 A1* | 5/2007 | Levinski ............. G03F 7/70633 257/48 |
| 2008/0317329 A1 | 12/2008 | Shibuya et al. |
| 2009/0037134 A1* | 2/2009 | Kulkarni ............ G01N 21/9501 702/127 |
| 2009/0309022 A1* | 12/2009 | Gunji ................. G01N 23/2251 250/307 |
| 2010/0235114 A1* | 9/2010 | Levy .................. G01N 21/9505 702/40 |
| 2011/0116085 A1* | 5/2011 | Lim ....................... H01L 22/12 356/237.5 |
| 2011/0196639 A1 | 8/2011 | Chen et al. |
| 2011/0204484 A1* | 8/2011 | Van Der Schaar . G03F 7/70566 257/618 |
| 2012/0029858 A1* | 2/2012 | Kulkarni ............ G05B 23/0297 702/108 |
| 2014/0072203 A1 | 3/2014 | Wu et al. |
| 2014/0193065 A1 | 7/2014 | Chu et al. |
| 2014/0270474 A1 | 9/2014 | Huang et al. |

* cited by examiner

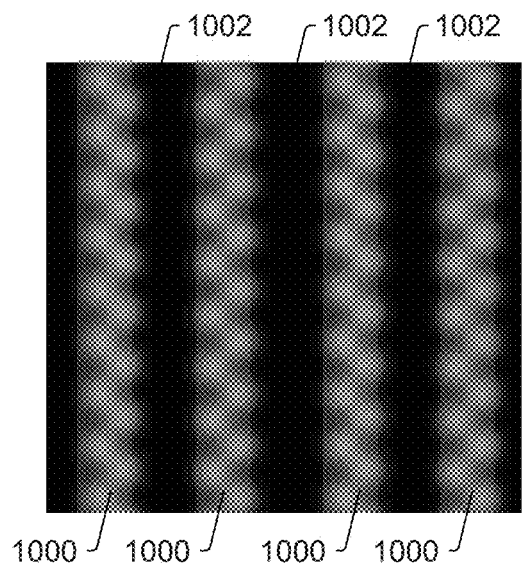
Fig. 10
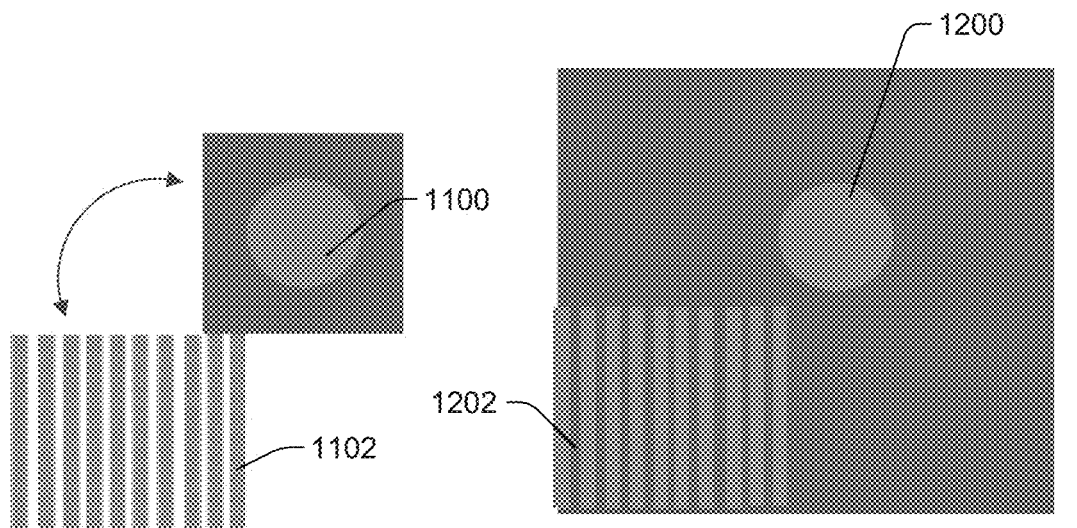
Fig. 11
Fig. 12

DEFECT DETECTION USING STRUCTURAL INFORMATION

BACKGROUND OF THE INVENTION

1. Field of the Invention

The present invention generally relates to systems and methods for defect detection using structural information.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

Some current inspection methods for array areas on specimens include performing defect detection in a rectangular care area covering an entire array region. Gray level values in images generated for the array areas are used to divide the images into different areas (called segmentation). These areas are meant to correspond to different structures of the specimen. The gray level segmentation may then be used to guide sensitivity settings for defect detection.

However, correspondence between gray level values and wafer structures may not be unique. For example, n-type metal-oxide-semiconductor (NMOS) and p-type MOS (PMOS) structures may have similar gray level values. Due to process variation, the gray level values on the same structure can vary across specimens or between specimens. Consequently, the result may not be a clear indication about wafer structures.

Accordingly, it would be advantageous to develop systems and methods for detecting defects on a specimen that do not have one or more of the disadvantages described above.

SUMMARY OF THE INVENTION

The following description of various embodiments is not to be construed in any way as limiting the subject matter of the appended claims.

One embodiment relates to a system configured to detect defects on a specimen based on structural information. The system includes an inspection subsystem that includes at least an energy source and a detector. The energy source is configured to generate energy that is directed to a specimen. The detector is configured to detect energy from the specimen and to generate output responsive to the detected energy. The system also includes one or more computer subsystems configured for separating the output generated by the detector in an array area on the specimen into at least first and second segments of the output based on one or more characteristics of one or more structures in the array area such that output in different segments has been generated in different locations in the array area in which the one or more structures having different values of the one or more characteristics are formed. In addition, the one or more computer subsystems are configured for detecting defects on the specimen by applying one or more defect detection methods to the output based on whether the output is in the first segment or the second segment.

Another embodiment relates to a computer-implemented method for detecting defects on a specimen based on structural information. The method includes the separating and detecting steps described above. The separating and detecting steps are performed by one or more computer subsystems.

Each of the steps of the method may be further performed as described herein. In addition, the method may include any other step(s) of any other method(s) described herein. Furthermore, the method may be performed by any of the systems described herein.

Another embodiment relates to a non-transitory computer-readable medium storing program instructions executable on a computer system for performing a computer-implemented method for detecting defects on a specimen based on structural information. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which:

FIG. 10 is an image of an example of a portion of an array area on a specimen with different structures defined therein;

FIG. 11 is a schematic diagram of an example of a unique structure that may be formed on a specimen and a spatial relationship between the unique structure and one or more structures in an array area of the specimen;

FIG. 12 is an image of the unique structure and one or more structures shown in FIG. 11;

Figure 1:
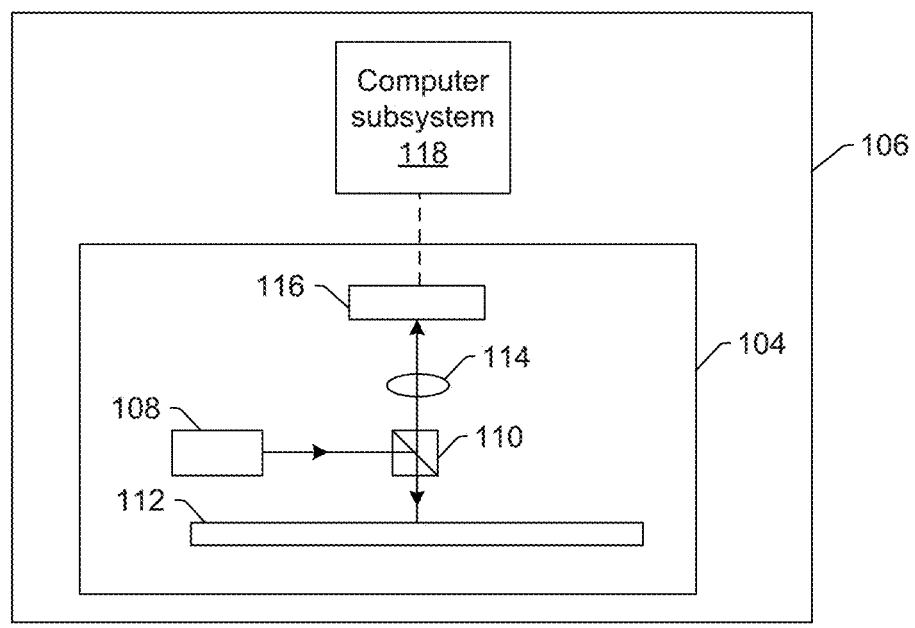
FIG. 1 is a schematic diagram illustrating a side view of an embodiment of a system configured to detect defects on a specimen based on structural information.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally provide new approaches to defect detection in array areas on specimens such as patterned semiconductor wafers that include acquiring and representing structural information and applying the structural information in specimen inspection. The embodiments described herein can be used to produce more yield relevant results for such specimens. One embodiment relates to a system configured to detect defects on a specimen based on structural information. The specimen may include, in some embodiments, a wafer. In other embodiments, the specimen may include a reticle. The wafer and the reticle may include any wafer and reticle known in the art.

The system includes an inspection subsystem that includes at least an energy source and a detector. The energy source is configured to generate energy that is directed to a specimen. The detector is configured to detect energy from the specimen and to generate output responsive to the detected energy. One embodiment of such an inspection subsystem is shown in FIG. 1 as inspection subsystem 104 of system 106. In the embodiment shown in this figure, the inspection subsystem is an optical or light-based inspection subsystem. For example, as shown in FIG. 1, the inspection subsystem includes light source 108, which may include any suitable light source known in the art such as a broadband plasma light source.

Light from the light source may be directed to beam splitter 110, which may be configured to direct the light from the light source to specimen 112. The light source may be coupled to any other suitable elements (not shown) such as one or more condensing lenses, collimating lenses, relay lenses, objective lenses, apertures, spectral filters, polarizing components and the like. As shown in FIG. 1, the light may be directed to the specimen at a normal angle of incidence. However, the light may be directed to the specimen at any suitable angle of incidence including near normal and oblique incidence. In addition, the light or multiple light beams may be directed to the specimen at more than one angle of incidence sequentially or simultaneously. The inspection subsystem may be configured to scan the light over the specimen in any suitable manner.

Light from specimen 112 may be collected and detected by one or more detectors of the inspection subsystem during scanning. For example, light reflected from specimen 112 at angles relatively close to normal (i.e., specularly reflected light when the incidence is normal) may pass through beam splitter 110 to lens 114. Lens 114 may include a refractive optical element as shown in FIG. 1. In addition, lens 114 may include one or more refractive optical elements and/or one or more reflective optical elements. Light collected by lens 114 may be focused to detector 116. Detector 116 may include any suitable detector known in the art such as a charge coupled device (CCD) or another type of imaging detector. Detector 116 is configured to generate output that is responsive to the reflected light collected by lens 114. Therefore, lens 114 and detector 116 form one channel of the inspection subsystem. This channel of the inspection subsystem may include any other suitable optical components (not shown) known in the art. The output of the detector may include, for example, images, image data, signals, image signals, or any other output that can be generated by a detector suitable for use in an inspection system.

Since the inspection subsystem shown in FIG. 1 is configured to detect light specularly reflected from the specimen, the inspection subsystem is configured as a bright field (BF) inspection system. Such an inspection subsystem may, however, also be configured for other types of inspection. For example, the inspection subsystem shown in FIG. 1 may also include one or more other channels (not shown). The other channel(s) may include any of the optical components described herein such as a lens and a detector, configured as a scattered light channel. The lens and the detector may be further configured as described herein. In this manner, the inspection subsystem may also be configured for dark field (DF) inspection.

The system also includes one or more computer subsystems. For example, as shown in FIG. 1, the system may include computer subsystem 118 that is coupled to the inspection subsystem such that the computer subsystem can receive output generated by the detector of the inspection subsystem. For example, the computer subsystem may be coupled to detector 116 and any other detectors included in the inspection subsystem such that the computer subsystem can receive output generated by the detector(s). The computer subsystem is configured for performing the steps described further herein. The computer subsystem(s) (also referred to herein as "computer system(s)") and the system may be further configured as described herein.

It is noted that FIG. 1 is provided herein to generally illustrate a configuration of an inspection subsystem that may be included in the system embodiments described herein. Obviously, the inspection subsystem configuration described herein may be altered to optimize the performance of the inspection subsystem as is normally performed when designing a commercial inspection system. In addition, the systems described herein may be implemented using an existing inspection subsystem (e.g., by adding functionality described herein to an existing inspection system) such as the 29xx/28xx series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

Furthermore, although the system is described herein as being an optical or light-based inspection system, the inspection subsystem may be configured as an electron beam based inspection subsystem (not shown). For example, the energy source of the inspection subsystem may be configured to generate electrons and the detector may be configured to detect electrons returned from the specimen. The electron beam based inspection subsystem may be any suitable electron beam based inspection subsystem included in any suitable commercially available electron beam inspection system.

Figure 2:
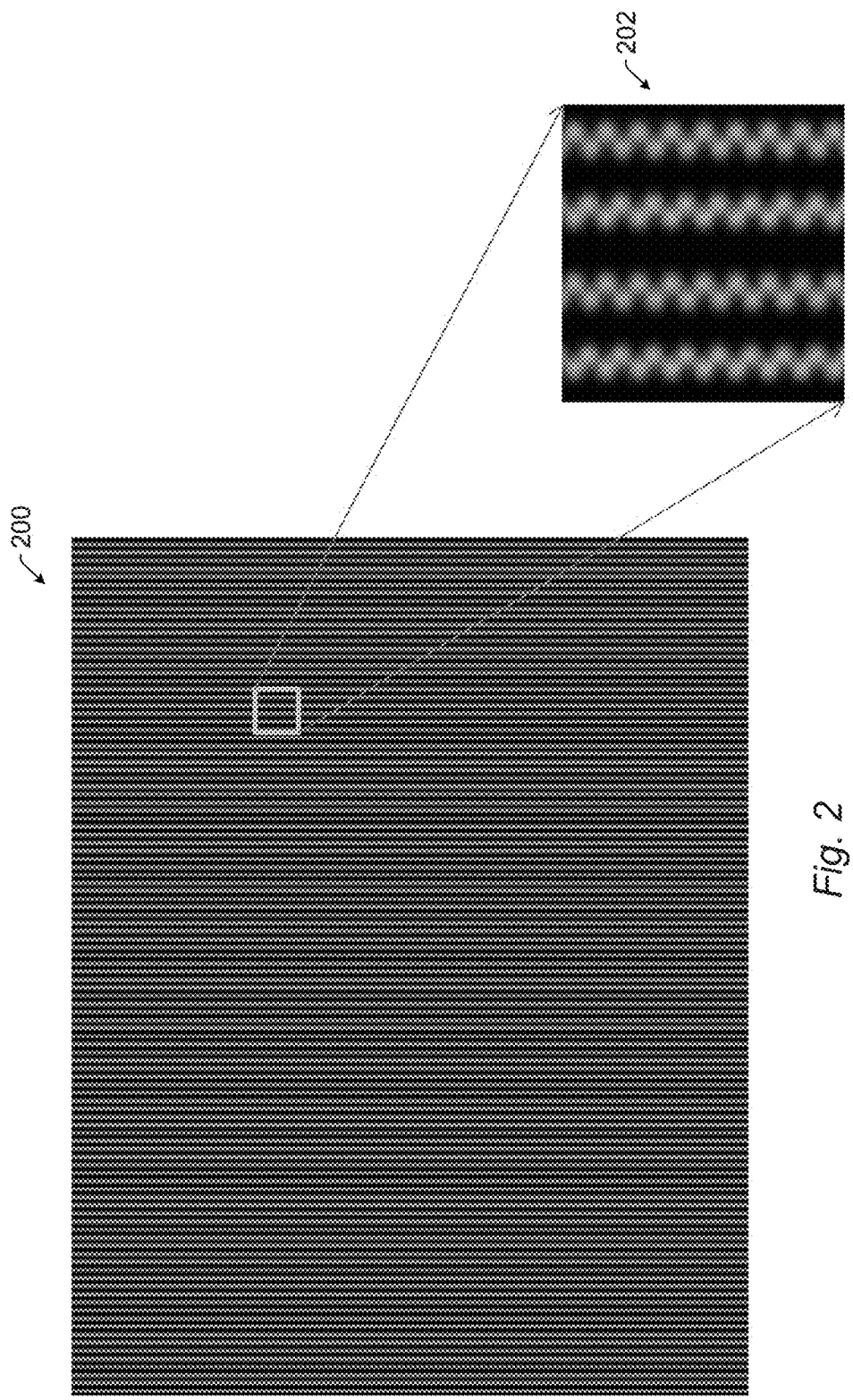
FIG. 2 is an image of an example of an array area on a specimen and an image of a cell within the array area.

The computer subsystem(s) are configured for separating the output generated by the detector of the inspection subsystem in an array area on the specimen into at least first and second segments of the output based on one or more characteristics of one or more structures in the array area such that the output in different segments has been generated in different locations in the array area in which the one or more structures having different values of the one or more characteristics are formed. The term "array area" refers to the area in a die where the pattern repeats periodically. The basic repeating pattern is called a "cell." Array areas are usually inspected by a cell-to-cell comparison instead of a die-to-die comparison. FIG. 2 illustrates one example of an array area and a cell contained therein. For example, as shown in FIG. 2, image 200 of an array area shows the repeating structures that may be formed within the array area. The basic structure within the array area is called a cell, one image for which is shown by image 202, which repeats spatially in the array area.

The embodiments described herein use structural information for defect detection. Structural information is more relevant and more robust for separating defects of interest (DOIs) from nuisance events. As will be described further herein, the embodiments may be configured to acquire structural information, represent structural information, and apply structural information in specimen inspection.

Since the structural information described herein is based on the structure(s) in an area on a specimen, the structural information may vary from specimen type to specimen type. In other words, different structural information may be used to represent different devices. The embodiments described herein may be programmed with such structure information. For example, during setup of inspection of the specimen, structural information for the specimen may be encoded in software to be used during the inspection. Separating the output may be performed during inspection of the specimen as the output is acquired. In this manner, the structures on the specimen may be identified during inspection (i.e., during run time).

In one embodiment, separating the output is not based on one or more characteristics of the output. For example, some currently used inspection methods perform segmentation of inspection system output based on gray levels of the output. In contrast, separating the output as described herein may be performed independent of any characteristics of the output itself. For example, even if the output generated for different instances of one type of structure formed on a specimen, which has one or more structural characteristics that are different from other types of structures on the specimen, has different gray levels, all of that output may be separated into the same segment. In this manner, the output separated into one of the segments may have different characteristics of the output even though it was all generated for different instances of the same structure formed on the specimen.

Unlike the embodiments described herein, therefore, current segmentation may be based on gray levels which may not indicate structures on the specimen. Therefore, segmentation based on gray levels is different than the segmentation for the array areas described herein which is based on structure information. Structures indicate functionality and process of wafer patterns and noise sources. Inspection guided by structures will produce more yield relevant results.

In one such example, in currently performed die-to-die (random area) or cell-to-cell (array area) inspection, output generated for a region in the area of the specimen being inspected may be separated into different segments based on gray levels or other characteristics of the output. However, in the embodiments described herein for cell-to-cell (array) inspection, output generated for a region in the area of the specimen being inspected may be separated, as described further herein, into first output generated at locations of a first type of structure on the specimen, second output generated at locations of a second type of structure on the specimen, and so on. All of the output determined to be generated for one type of the structures may then be further segmented based on any other information (e.g., gray levels) available to the embodiments described herein. Similar segmentation may be separately performed for any of the other structure types identified in the inspection subsystem output.

In another embodiment, the one or more characteristics of the structures are determined based on one or more scanning electron microscope (SEM) images of the specimen or another specimen of the same type as the specimen. In this manner, the structural information used in the embodiments described herein may be acquired through SEM image(s). As such, the embodiments described herein may be configured for understanding structures such as wafer structures with SEM images. Wafer structures indicate the spatial layout of polysilicon, contact holes, n-type metal-oxide-semiconductor (NMOS), p-type MOS (PMOS), etc. Users can delineate particular structures in high resolution SEM images. Analyzing the SEM image to determine the one or more characteristics of the structures may be performed during setup of the inspection performed for the specimen. In this manner, the embodiments described herein do not necessarily use or need information in a design file.

Figure 3:
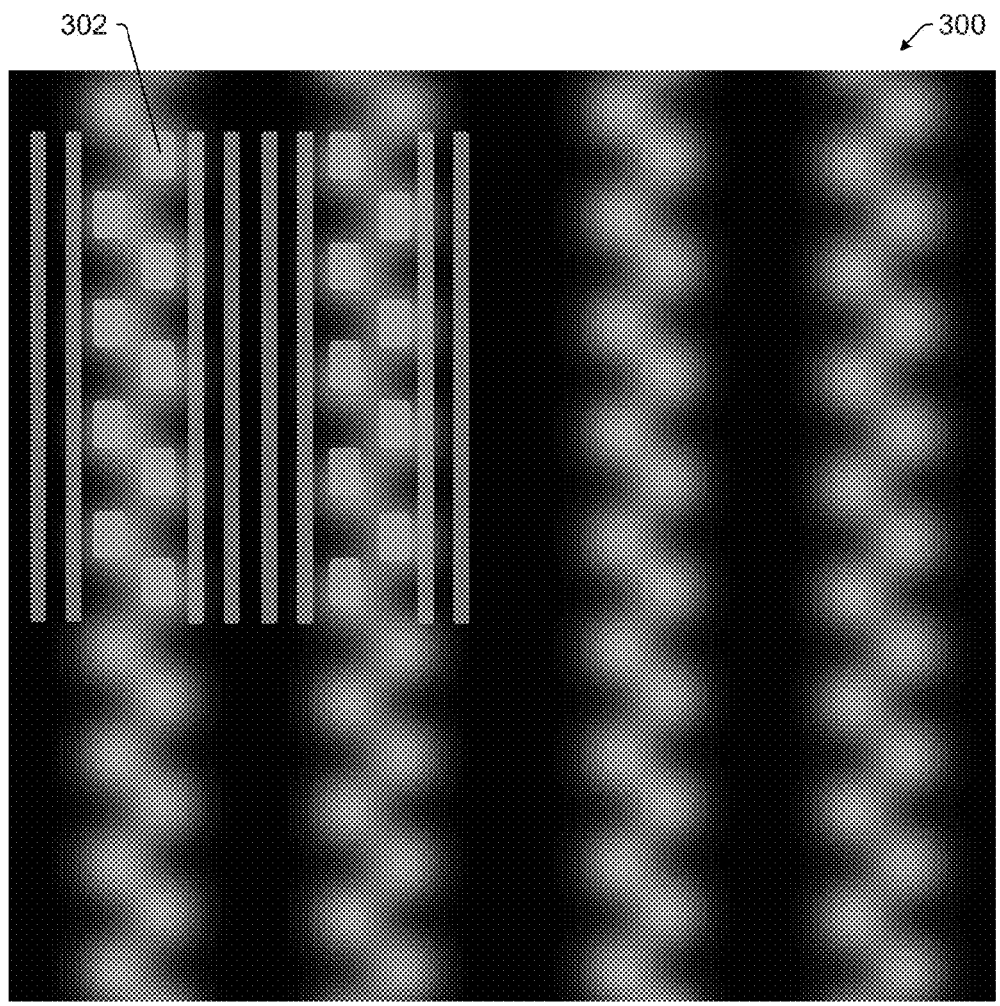
FIG. 3 is an image of an example of a portion of an array area on a specimen with structural information correlated thereto.

In an additional embodiment, separating the output includes correlating one or more SEM images of the specimen or another specimen of the same type as the specimen with the output and transferring the one or more characteristics of the one or more structures from the one or more SEM images to the output correlated thereto. For example, by correlating SEM images with inspection images, structural information can be transferred from SEM images onto inspection images. In one such example, as shown in FIG. 3, inspection image 300 of a portion of an array area may be generated by an inspection subsystem as described herein. Structural information 302, which may be acquired from a SEM image, may then be aligned with the inspection image. The structural information can then be assigned to the pixels in the inspection image to which it has been aligned. In this manner, if structural information 302 contains information for different structures, different structural information may be assigned to the pixels in the portion of the inspection image to which the structural information has been aligned. Correlating the SEM image with the inspection image and representing the structural information in the inspection image may be performed during setup of the inspection performed for the specimen. In addition, the same structure repeats in the array areas. In order to find the same structure in images during inspection only the basic structure, for example, a patch image of array at a particular die location may be stored. The patch image represents the structural information.

In a further embodiment, the one or more characteristics of the structures are determined based on a design for the specimen. In this manner, the structural information used in the embodiments described herein may be acquired through a design file. For example, the embodiments described herein may be configured to understand the structures on the specimen with semiconductor design files such as graphical data stream (GDS) files. Similar to the SEM images, users can correlate design patterns to optical images. Analyzing the design to determine the one or more characteristics of the structures may be performed during setup of the inspection performed for the specimen. The design used in the embodiments described herein does not include any rendered, synthetic, or simulated images from the design.

In some embodiments, separating the output includes correlating a design for the specimen with the output and transferring the one or more characteristics of the one or more structures from the design to the output correlated thereto. For example, by correlating the design with inspection images, structural information can be transferred from the design onto inspection images. Such correlating may be performed as described further herein with respect to SEM images. For example, structural information 302 shown in FIG. 3 may be from a design pattern for the specimen. The structural information from the design can then be assigned to the pixels in the inspection image to which the design has been aligned. In this manner, the structural information can be carried through inspection images and geometry obtained from semiconductor design. Correlating the design with the inspection image and representing the structural information in the inspection image may be performed during setup of the inspection performed for the specimen. In addition, the same structure repeats in the array areas. In order to find the same structure in images during inspection only the basic structure, for example, a patch image of array at a particular die location may be stored. The patch image represents the structural information.

In a further embodiment, separating the output includes applying one or more rules to the output, and the one or more rules are based on differences in the one or more characteristics between different types of the one or more structures. For example, the structural information used in the embodiments described herein may be acquired through user knowledge. In this manner, the embodiments described herein may be used to delineate wafer structural information based on user knowledge. In addition, the inspection image can be compared to a SEM image as described further herein for the same structure, then rules can be created to identify the structure in the inspection image. In this manner, the embodiments described herein may analyze patterns inside array areas. Multiple rules may be applied based on structural information input from users.

During set up of the embodiments described herein using an image-based approach, a set of rules to identify array structures based on common patterns of structures may be defined and encoded in software. A user may input structure information based on the image of array structures. The computer subsystem(s) may then analyze the image intensities, projection, variance, and symmetry and determine which rules should be applied to identify array structures for this type of array areas on the wafer. These steps may be performed for one type of array structure and then repeated for any other types of array structures. The computer subsystem(s) may then save the rules into an inspection recipe. During defect detection, given an image, the computer subsystem(s) may apply the predetermined rules to the output of the inspection subsystem. Since the array structures repeat, an averaged image of multiple repeats can be calculated to reduce the noise on the image. The structures may then be identified in the output.

Figure 4:
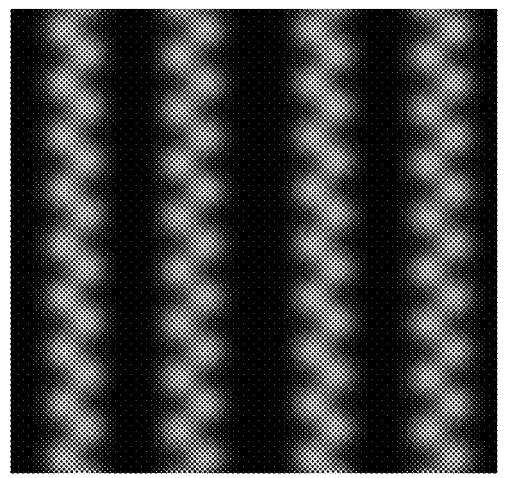
FIG. 4 is a gray level representation of an example of a portion of an array area on a specimen.
Figure 5:
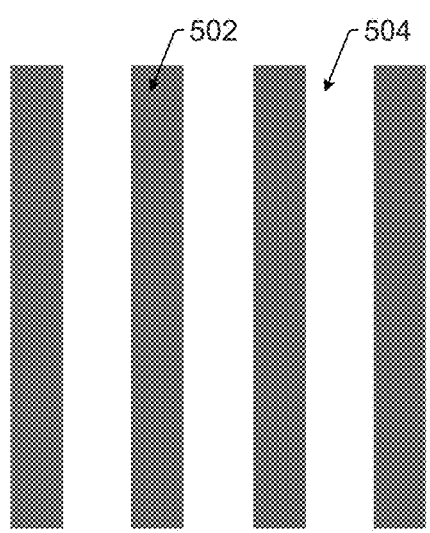
FIG. 5 is a schematic diagram illustrating an embodiment of a spatial relationship of the portion of the array area shown in FIG. 4.
Figure 6:
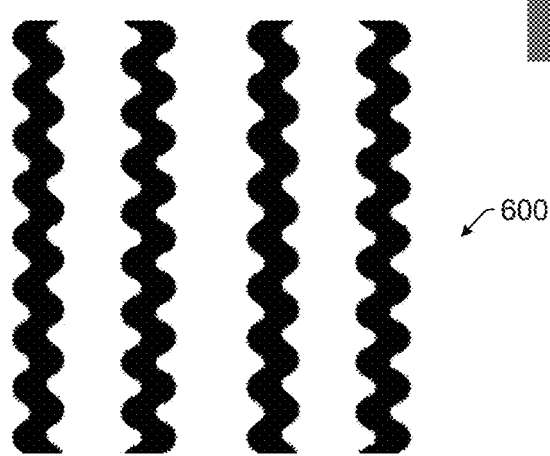
FIG. 6 is a schematic diagram illustrating an embodiment of a binary mask representation of the portion of the array area shown in FIG. 4.

The structural information may be represented in a number of different ways. For example, the structural information can be transferred and represented in terms of gray levels or spatial relationship of gray levels or binary masks. Examples of such representations are shown in FIGS. 4-6. For example, as shown in FIG. 4, gray level representation 400 may be used to represent structural information. In addition, as shown in FIG. 5, spatial relationship 500 may be used to represent the same structural information as shown in FIG. 4. For example, dark portions 502 of FIG. 5 may correspond to the structures shown in FIG. 4 having a "zigzag" or asymmetrical shape while white portions 504 may correspond to the structures shown in FIG. 4 that have a symmetrical shape. Furthermore, as shown in FIG. 6, binary mask 600 may be used to represent the same structural information as shown in FIG. 4.

In this manner, identifying the different portions of the output generated in different portions of the specimen containing different structures during run time may be performed in a number of different ways. For example, if the structural information is identified in the design file, the design patterns can be aligned to the patterns in the inspection image, then structures in the inspection image, which correspond to the structural information in the design patterns, can be identified. This approach is a type of design-to-image alignment. In addition, the inspection image generated during setup that contains structural information can be correlated to the inspection image generated during run time. This approach is a type of image-to-image alignment. Rules of structural information can also be programmed in software. At run time, the software may identify the structural information based on rides. This approach is a kind of image analysis.

In one embodiment, the one or more computer subsystems are configured for locating the one or more structures in the output based on the output generated for one or more unique structures formed on the specimen and a spatial relationship between the unique structures and the one or more structures. The embodiments described herein therefore provide a specific approach to pixel-to-design alignment. For example, unique structures such as corners or page breaks can be used to locate non-unique (repeating) structures by defining spatial offsets. In particular, since patterns in array (e.g., SRAM) areas are dense and repeating, the patterns are not unique in this area and are not good for alignment. The non-repeating patterns close to memory areas are near array corners. In order to perform alignment near array corners, the alignment sites may be searched first. The embodiments described herein are therefore unlike currently used methods in which images are analyzed since this approach does not ensure that all sites found by search are near the desired areas such as SRAM corners. Instead, the embodiments described herein may use the design information. In this manner, SRAM corners and other unique structures in the design can be easily identified in design files. The computer subsystem(s) may be configured to find the unique structures in a recipe setup stage. The locations of these unique structures can be refined during inspection. The locations can housed to identify structures in inspection images. For example, during alignment site search, the SRAM corners generated from design files may be provided to the computer subsystem(s).

Figure 13:
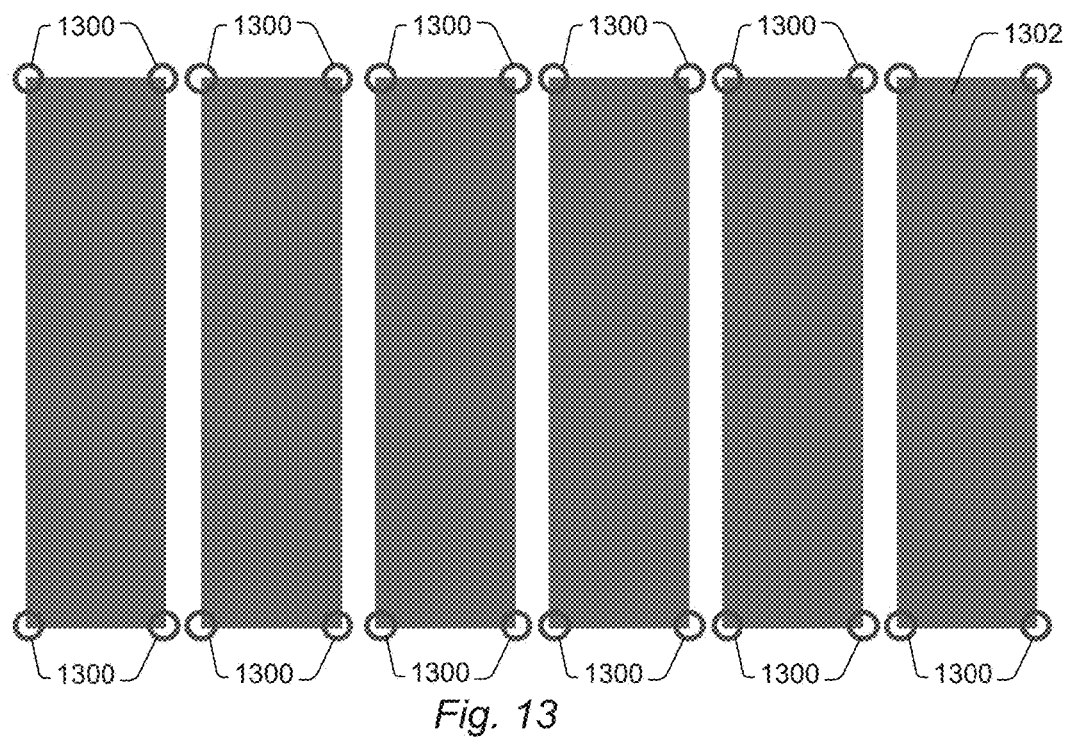
FIG. 13 is a schematic diagram of an example of unique structures that may be formed on a specimen and used for locating one or more structures in an array area on the specimen.

In this manner, the unique structure(s) can be used to help align a mask of a specimen structure to an image. For example, as shown in FIG. 11, during set up of the inspection process, unique structure 1100 outside of the array structures may be identified and registered to mask 1102 of the structures in the array area. In other words, a spatial relationship between the unique structure and the mask may be determined during setup. In this manner, as shown in FIG. 12, during inspection, image 1200 of the unique structure may be aligned with the unique structure image acquired during set up and the mask of the array structure should be aligned with array structure 1202 in image 1204. FIG. 13 illustrates additional examples of unique structures that may be used by the embodiments described herein. For example, the unique structures my include SRAM corners 1300 of SRAM blocks 1302.

In some embodiments, the one or more characteristics include a repeating pitch of the one or more structures. For example, the repeating pitch of array structures can be part of the information used to represent structures (i.e., in combination with other structural information described herein such as symmetry information). In general, however, the repeating pitch of the structures would not be used by itself in the embodiments described herein.

In another embodiment, the one or more characteristics include one or more topologic characteristics of the one or more structures. In this manner, the structural information may include topologic information. Topologic information is advantageous for use in the embodiments described herein since such information describes properties of geometric forms that remain invariant under certain transformations such as bending or stretching. Therefore, the structural information used in the embodiments described herein my remain the same even if the shape or dimension of the structure varies from one device to another device.

Figure 7:
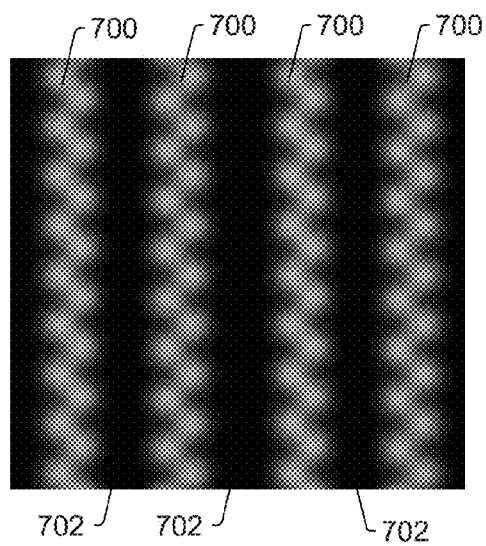
FIGS. 7-9 are different images of an example of a portion of an array area on a specimen.
Figure 8:
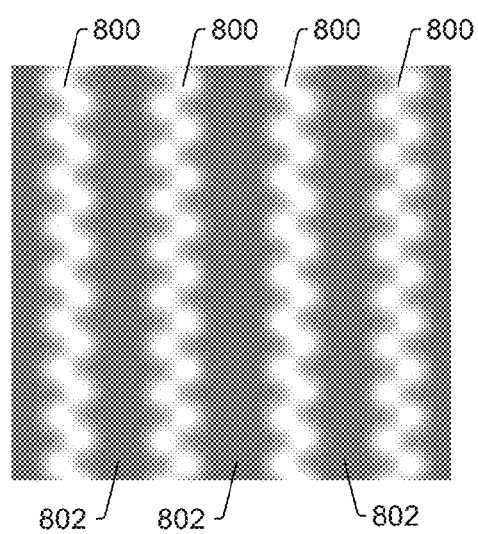
Figure 9:
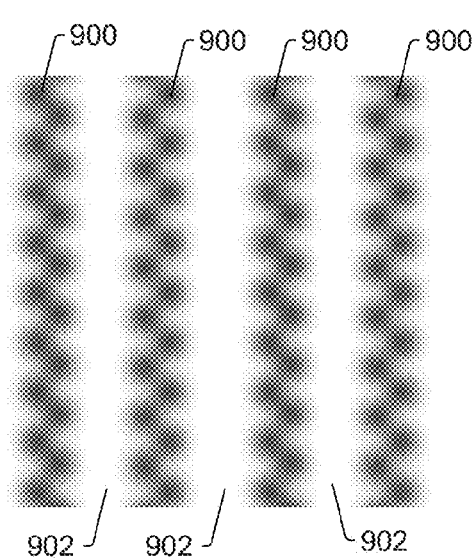

In some embodiments, the one or more characteristics include symmetrical and asymmetrical characteristics of the one or more structures. Symmetrical information about the structures formed on the specimen is one example of structural information that is more robust to color variation. For example, as shown in FIG. 7, an inspection image for a specimen may include horizontally asymmetrical intensities 700 that correspond to a first structure and symmetrical intensities 702 that correspond to a second structure different than the first. If image gray level is used to describe the first and second structures using this inspection image, then the bright intensities correspond to the first structure and the dark intensities correspond to the second structure. This description of the relationship between intensities and structures is suitable for the inspection image shown in FIG. 7, but not for the inspection image shown in FIG. 9, which is generated for the same area as that included in the inspection image of FIG. 7. In particular, in the inspection image of FIG. 9, dark intensities 900 are horizontally asymmetrical and correspond to the first structure while bright intensities 902 are symmetrical and correspond to the second structure. For the image shown in FIG. 8, the shape and gray levels of asymmetrical structures 800 and symmetrical structures 802 are different from the images shown in FIGS. 7 and 9. However, symmetry information is still preserved in this image. As such, symmetry is a better, robust descriptor no matter how gray level changes. For example, if optics mode(s) of the inspection subsystem are changed, the gray levels of structures may change dramatically while the symmetry characteristics of the structures and their corresponding intensities in the images remain unchanged. In this manner, the embodiments described herein may be configured to use symmetry information from both images and design to identify different structures in inspection subsystem output.

In another embodiment, separating the output includes determining symmetry scores for different regions in the output and a design for the wafer, aligning the symmetry scores for the output to the symmetry scores for the design, and separating the output based on results of the aligning and information about which of the one or more structures correspond to the symmetry scores for the design. In this manner, the embodiments described herein may be configured for symmetry-based alignment. For example, a key enabler for context based inspection (CBI) may be pixel-to-design alignment (PDA). In one such example, a CBI system may render an image of a design clip and align it with a corresponding wafer image. With a relatively good PDA, the care area generated from design can be aligned to the wafer image substantially accurately.

However, design clips and wafer images have substantially different modalities. The interactions among the wafer printing process, wafer pattern, and inspection system is extremely complicated. These problems make image rendering the most difficult task in PDA. Although a statistical algorithm may be used to mitigate the impact from the unsatisfactory image rendering to a relatively large extent and provide a considerable cushion to the individual PDA misalignment, the need for individual PDA at the subpixel level for design dips that are difficult to render, such as the areas near SRAM areas, is inevitable.

Symmetry-based alignment is inspired by the fact that symmetry is a fundamental characteristic of geometry in many design clips and inspection images. In addition, symmetry is often more invariant to large appearance changes than image intensity or gradients.

Symmetry-based alignment may include calculation of the symmetry score for each pixel and the alignment of the symmetry score. For example, the computer subsystem(s) may be configured to determine first symmetry scores from the pattern in a design and second symmetry scores from the pattern in an inspection image. The calculation of the symmetry may be performed to determine how similar an image region, when flipped about an axis, is to another image region. The computer subsystem(s) may then compute offsets by correlation of the first and second symmetry scores. The design and inspection image may then be aligned by applying the offsets. The alignment of the symmetry scores is to find the best subpixel offsets that can maximize the cross-correlation between the symmetry scores of the design clips and that of the inspection images.

In one embodiment, the first and second segments are located in one or more care areas. For example, the embodiments described herein do not change the care areas selected for array inspection, which define regions for cell-to-cell inspection. Instead, masks may be used inside array care areas and indicate different detection sensitivities. For example, for die-to-die inspection, since a pixel is compared to another pixel in another die, die-to-die inspection does not require specifying neighboring information, for example, an area for cell-to-cell inspection. However, for cell-to-cell inspection in array regions, a pixel is compared to another pixel in the same image. Region is specifically used to indicate the areas for cell-to-cell inspection. Therefore, the embodiments described herein do not change the region or care area in which inspection is performed in the array area. The segmentation described herein is performed within the region or care area in which the inspection is performed.

The computer subsystem(s) are also configured for detecting defects on the specimen by applying one or more defect detection methods to the output based on whether the output is in the first segment or the second segment. In this manner, the embodiments described herein perform defect detection using structural information. In addition, the one or more defect detection methods may be applied separately and independently to the different segments of the output. For example, the defect detection performed in one of the segments may be different from the defect detection performed in another of the different segments. In addition, defect detection may not be performed for all of the different segments. For instance, depending on the structures whose output is included in each of the different segments, defect detection may be performed in one of the different segments but not another of the different segments.

In an additional embodiment, applying the defect detection method(s) includes applying the one or more defect detection methods having a first set of parameters to only the output included in the first segment and applying the one or more defect detection methods having a second set of parameters different from the first set of parameters to only the output included in the second segment. For example, different noise statistics (depending on the defect detection method(s), e.g., a 2D histogram of difference vs. median gray level for the MDAT defect detection algorithm used by some inspection systems currently available from KLA-Tencor) may be generated for each different structure. In contrast, in currently used methods, noise statistics may be calculated on a region basis, i.e., a multi-structure basis. Therefore, unlike the currently used methods, the embodiments described herein allow defect detection sensitivity to adapt to noise for different structures separately. For each structure, segmentation can be used for further dividing images into meaningful areas. If the number of nuisance defects is relatively large on certain structures or segments, the user can set a lower sensitivity for those structures or segments to suppress nuisance defects.

The first and second sets of parameters may include one or more different parameters or values of a parameter of the same defect detection method(s). For example, the first set of parameters for the one or more defect detection methods may include a first threshold for one defect detection algorithm and the second set of parameters for the one or more defect detection methods may include a second threshold for the same defect detection algorithm. In a different example, the first set of parameters may include parameters for a first defect detection algorithm, and the second set of parameters may include parameters for a second defect detection algorithm different than the first. The first and second sets of parameters may be different in any other way that would produce different defect detection in different segments of the output. In addition, the embodiments described herein are not specific to any one defect detection method or type of defect detection. Instead, the embodiments described herein can be used with any defect detection method(s) whose parameters can be changed depending on the segment of the output to which it/they are being applied.

In another embodiment, the one or more defect detection methods applied to the output in the first segment have a different detection sensitivity than the one or more defect detection methods applied to the output in the second segment. For example, the system can use the structural information to apply different defect detection sensitivities and/or algorithms to different areas that correspond to different structures. In this manner, different detection sensitivities and/or algorithms may be applied to different structures based on their levels of interest.

In one embodiment, applying the defect detection method(s) includes determining one or more characteristics of noise for the first segment based on only the output in the first segment and determining one or more parameters of the one or more defect detection methods based on the determined one or more characteristics of the noise. In one such example, for areas where noise is relatively high, lower sensitivities may be applied. On the other hand, where noise is relatively low, higher sensitivities may be applied. The sensitivity used for detecting defects in different structures having one or more different characteristics may be determined during setup of the inspection for the specimen.

Unlike currently used methods in which noise statistics are generated from different gray levels, in the embodiments described herein, different noise statistics may be generated for different structures. For example, in currently used methods, noise statistics may be generated for the entire inspection image shown in FIG. 10. However, in the embodiments described herein, different noise statistics may be determined for different structures shown in the inspection image. For example, first noise statistics may be determined using only portions 1000 of the image and second noise statistics may be determined using only portions 1002 of the image. In this manner, the first noise statistics may be determined for the portions that include mixed gray levels while the second noise statistics may be determined for the portions that include the mostly black gray levels. In another example, once the structures are identified, noise statistics such as a 2D histogram, which typically includes difference value vs. median gray level, may be created for each structure. Defect detection parameters may then be applied based on noise on each structure. In this manner, unlike methods that do not separate output based on structural information for a specimen such that the same defect detection parameters are applied to all structures, with the embodiments described herein, different defect detection parameters can be used for different structures. Therefore, overall, the embodiments described herein will have improved defect detection sensitivity.

In this manner, applying the defect detection method(s) as described herein may be an image-based approach that enables different sensitivities to be applied to the pixels in array areas based on their locations in different structures, e.g., P cell structure or N cell structure, through image analysis. If different noise levels exist on different structures, this approach will effectively suppress the nuisance events from non-structures of interest (non-SOIs) and will enhance the inspection sensitivity on SOI.

Figure 14:
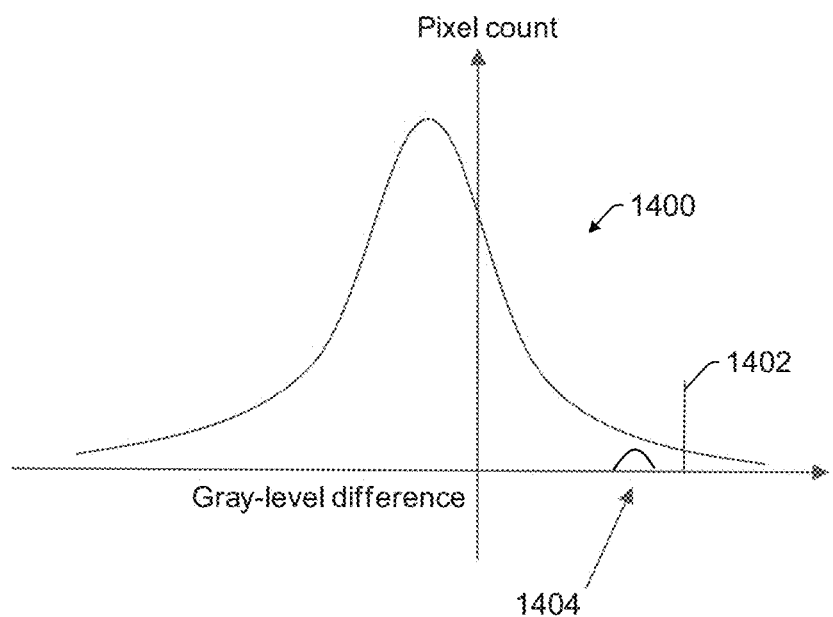
FIGS. 14-16 are plots showing examples of different results of applying one or more defect detection methods to output of a detector of an inspection subsystem.

The defect detection method(s) that are applied to the output by the embodiments described herein are therefore different than currently used defect detection methods. For example, in some currently used methods, pixel statistics may be created from both SOI and non-SOI. Since noise can be relatively high on non-SOI, defective pixels may not be detectable. For example, as shown in FIG. 14, a currently used defect detection method may generate pixel statistics such as pixel count vs. gray level difference and plot 1400 of these pixel statistics may be generated. Detection threshold 1402 may be determined based on the pixel statistics shown in this plot. Due to noise in the pixels (e.g., non-SOI pixels), the detection threshold determined based on these statistics may be too high to detect some defective pixels 1404. Therefore, some defective pixels may not be detected by the defect detection method.

Figure 15:
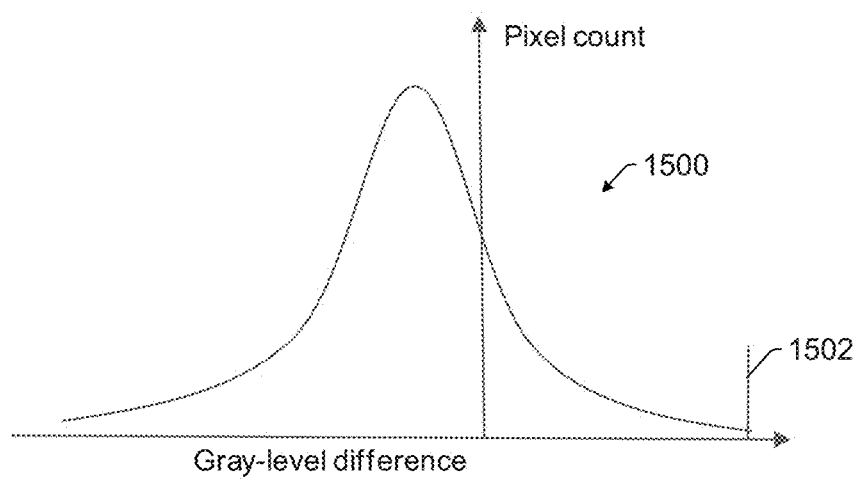
Figure 16:
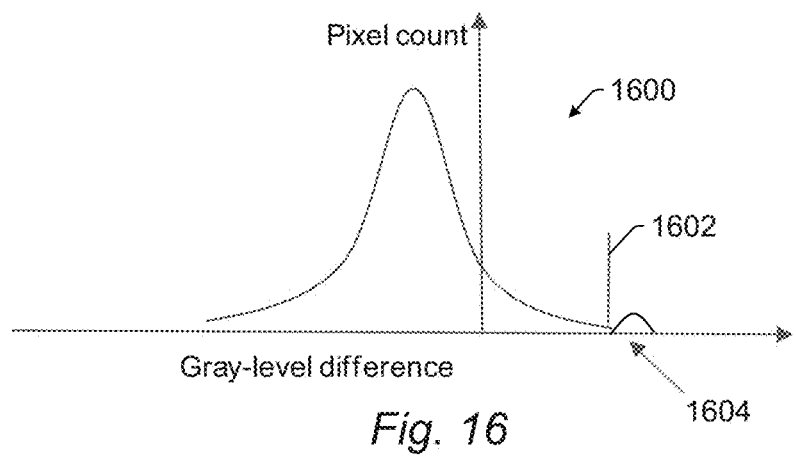

In contrast, the embodiments described herein may apply a defect detection method that generates pixel statistics from only non-SOI pixels, where the noise may be relatively high. The defect detection method may generate plot 1500 shown in FIG. 15 from these statistics. Based on these statistics, detection threshold 1502 may be determined. The detection threshold determined for these non-SOI pixels may be relatively high (i.e., relatively low sensitivity) to avoid detecting the relatively noisy pixels as defects. In addition, the embodiments described herein may apply a defect detection method that generates pixel statistics from only SOI pixels where a defect may be located and where noise is relatively low. The defect detection method may generate plot 1600 shown in FIG. 16 from these statistics. Based on these statistics, detection threshold 1602 may be determined. The detection threshold determined for these SOI pixels may be relatively low (i.e., relatively high sensitivity) such that defective pixels 1604 can be detected. In this manner, the defect detection method(s) may detect the defective pixels as defects since the defective pixels are detectable with the lower threshold.

In some embodiments, the one or more computer subsystems are configured for determining the values of the one or more characteristics of the one or more structures in which the defects are detected and storing the determined values as defect attributes for the defects. For example, structural information may be calculated for each defect as a defect attribute. In this manner, structure information can be assigned to defects detected on the specimen. Assigning the structure information to the defects may be performed during run time. These attributes can be used in defect post-processing for defect classification, sorting, or nuisance event removal. Nuisance filtering and/or defect classification may be performed during run time.

The embodiments described herein have a number of advantages over currently used methods for inspecting specimens. For example, since the structural information can be obtained either from SEM images or design files, the structural information has physical meaning and is more yield relevant than gray level information. In addition, for different devices, structural information may be different. Its representation can be customized during recipe setup. Furthermore, the structural information contains topologic information which is more robust than simple gray level values to color variation. The efficiency of nuisance suppression can therefore be much higher. In one such example, if noise comes from symmetrical structures and the goal is to suppress this noise, since the embodiments described herein can identify symmetrical structures on the specimen, noise from these areas can be suppressed. In another such example, if the DOIs are located in only one particular type of structure (e.g., structures that happen to be symmetrical), then the information about which type of structure a defect is located in can be used to separate defects into DOIs and nuisances. In this manner, defect detection using structural information can provide more yield relevant inspection results. In addition, since the embodiments described herein do not use simulated or rendered images of a design (e.g., an image of the design as it would be imaged by an inspection system after being formed on a specimen), the embodiments described herein can be used for areas on the wafer where such simulation or rendering is particularly difficult such as the areas near SRAM areas. In this manner, the embodiments described herein can perform pixel-to-design alignment for array areas for the purposes of output segmentation as described herein without needing or using simulated or rendered images.

Another embodiment relates to a computer-implemented method for detecting defects on a specimen based on structural information. The method includes the separating and detecting steps described above. These steps are performed by one or more computer systems, which may be configured according to any of the embodiments described herein.

Each of the embodiments of the methods described above may include any other step(s) of any other method(s) described herein. Furthermore, each of the embodiments of the methods described above may be performed by any of the systems described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 17:
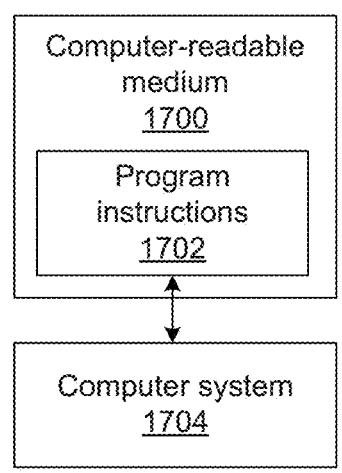
FIG. 17 is a block diagram illustrating one embodiment of a non-transitory computer-readable medium storing program instructions for causing a computer system to perform a computer-implemented method described herein.

Another embodiment relates to a non-transitory computer-readable medium storing program instructions executable on a computer system for performing a computer-implemented method for detecting defects on a specimen based on structural information. One such embodiment is shown in FIG. 17. For example, as shown in FIG. 17, non-transitory computer-readable medium 1700 stores program instructions 1702 executable on computer system 1704 for performing a computer-implemented method for detecting defects on a specimen based on structural information. The computer-implemented method may include any step(s) of any method(s) described herein.

Program instructions 1702 implementing methods such as those described herein may be stored on non-transitory computer-readable medium 1700. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

Computer system 1704 may take various forms, including a personal computer system, mainframe computer system, workstation, system computer, image computer, programmable image computer, parallel processor, or any other device known in the art. In general, the term "computer system" may be broadly defined to encompass any device having one or more processors, which executes instructions from a memory medium.

Further modifications and alternative embodiments of various aspects of the invention will be apparent to those skilled in the art in view of this description. For example, systems and methods for detecting defects on a specimen based on structural information are provided. Accordingly, this description is to be construed as illustrative only and for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to detect defects on a specimen based on structural information, comprising:
   an inspection subsystem comprising at least an energy source and a detector, wherein the energy source is configured to generate energy that is directed to a specimen, and wherein the detector is configured to detect energy from the specimen and to generate output responsive to the detected energy; and
   one or more computer subsystems configured for:
      separating the output generated by the detector in an array area on the specimen into at least first and second segments of the output based on one or more characteristics of one or more structures in the array area such that the output in different segments has been generated in different locations in the array area in which the one or more structures having different values of the one or more characteristics are formed, wherein said separating comprises determining symmetry scores for different regions in the output. and a design for the wafer, aligning symmetry scores for the output to the symmetry scores for the design, and separating the output based on results of said aligning and information about which of the one or more structures correspond to the symmetry scores for the design; and
      detecting defects on the specimen by applying one or more defect detection methods to the output based on whether the output is in the first segment or the second segment.

2. The system of claim 1, wherein said separating is not based on one or more characteristics of the output.

3. The system of claim 1, wherein the one or more characteristics of the structures are determined based on one or more scanning electron microscope images of the specimen or another specimen of the same type as the specimen.

4. The system of claim 1, wherein said separating further comprises correlating one or more scanning electron microscope images of the specimen or another specimen of the same type as the specimen with the output and transferring the one or more characteristics of the one or more structures from the one or more scanning electron microscope images to the output correlated thereto.

5. The system of claim 1, wherein the one or more characteristics of the structures are determined based on a design for the specimen.

6. The system of claim 1, wherein said separating further comprises correlating a design for the specimen with the output and transferring the one or more characteristics of the one or more structures from the design to the output correlated thereto.

7. The system of claim 1, wherein the one or more computer subsystems are further configured for locating the one or more structures in the output based on the output generated for one or more unique structures formed on the specimen and a spatial relationship between the one or more unique structures and the one or more structures.

8. The system of claim 1, wherein the one or more characteristics comprise a repeating pitch of the one or more structures.

9. The system of claim 1, wherein the one or more computer subsystems are further configured for determining the values of the one or more characteristics of the one or more structures in which the defects are detected and storing the determined values as defect attributes for the defects.

10. The system of claim 1, wherein the one or more characteristics comprise one or more topologic characteristics of the one or more structures.

11. The system of claim 1, wherein the one or more characteristics comprise symmetrical and asymmetrical characteristics of the one or more structures.

12. The system of claim 1, wherein the first and second segments are located in one or more care areas.

13. The system of claim 1, wherein said separating further comprises applying one or more rules to the output, and wherein the one or more rules are based on differences in the one or more characteristics between different types of the one or more structures.

14. The system of claim 1, wherein said applying comprises determining one or more characteristics of noise for the first segment based on only the output in the first segment and determining one or more parameters of the one or more defect detection methods based on the determined one or more characteristics of the noise.

15. The system of claim 1, wherein the one or more defect detection methods applied to the output in the first segment have a different detection sensitivity than the one or more defect detection methods applied to the output in the second segment.

16. The system of claim 1, wherein said applying comprises applying the one or more defect detection methods having a first set of parameters to only the output included in the first segment and applying the one or more defect detection methods having a second set of parameters different from the first set of parameters to only the output included in the second segment.

17. A non-transitory computer-readable medium, storing program instructions executable on a computer system for performing a computer-implemented method for detecting defects on a specimen based on structural information, wherein the computer-implemented method comprises:
   separating output generated by a detector of an inspection subsystem in an array area on a specimen into at least first and second segments of the output based on one or more characteristics of one or more structures in the array area such that the output in different segments has been generated in different locations in the array area in which the one or more structures having different values of the one or more characteristics are formed, wherein the inspection subsystem comprises at least an energy source and the detector, wherein the energy source is configured to generate energy that is directed to the specimen, wherein the detector is configured to detect energy from the specimen and to generate output responsive to the detected energy, and wherein said separating comprises determining symmetry scores for different regions in the output and a design for the wafer, aligning the symmetry scores for the output to the symmetry scores for the design, and separating the output based on results of said aligning and information about which of the one or more structures correspond to the symmetry scores for the design; and
   detecting defects on the specimen by applying one or more defect detection methods to the output based on whether the output is in the first segment or the second segment.

18. A computer-implemented method for detecting defects on a specimen based on structural information, comprising:

separating output generated by a detector of an inspection subsystem in an array area on a specimen into at least first and second segments of the output based on one or more characteristics of one or more structures in the array area such that the output in the different segments has been generated in different locations in the array area in which the one or more structures having different values of the one or more characteristics are formed, wherein the inspection subsystem comprises at least an energy source and the detector, wherein the energy source is configured to generate energy that is directed to the specimen, wherein the detector is configured to detect energy from the specimen and to generate output responsive to the detected energy, and wherein said separating comprises determining symmetry scores for different regions in the output and a design for the wafer, aligning the symmetry scores for the output to the symmetry scores for the design, and separating the output based on results of said aligning and information about which of the one or more structures correspond to the symmetry scores for the design; and detecting defects on the specimen by applying one or more defect detection methods to the output based on whether the output is in the first segment or the second segment, wherein said separating and said detecting are performed by one or more computer systems.

* * * * *